(12) United States Patent
Sekine

(10) Patent No.: US 9,263,491 B2
(45) Date of Patent: Feb. 16, 2016

(54) SOLID-STATE IMAGING APPARATUS, METHOD FOR MANUFACTURING THE SAME, AND CAMERA

(71) Applicant: CANON KABUSHIKI KAISHA, Tokyo (JP)

(72) Inventor: Yasuhiro Sekine, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/497,656

(22) Filed: Sep. 26, 2014

(65) Prior Publication Data

US 2015/0109501 A1 Apr. 23, 2015

(30) Foreign Application Priority Data

Oct. 22, 2013 (JP) ................................. 2013-219506

(51) Int. Cl.
H01L 27/146 (2006.01)
(52) U.S. Cl.
CPC ...... *H01L 27/1464* (2013.01); *H01L 27/14623* (2013.01); *H01L 27/14627* (2013.01); *H01L 27/14685* (2013.01)
(58) Field of Classification Search
CPC ............ H01L 27/1416; H01L 27/2427; H01L 1/4623; H01L 1/4685
See application file for complete search history.

(56) References Cited

U.S. PATENT DOCUMENTS

| 7,019,373 | B2 | 3/2006 | Hashimoto |
| 7,202,103 | B2 | 4/2007 | Sekine et al. |
| 7,420,236 | B2 | 9/2008 | Hashimoto |
| 7,709,918 | B2 | 5/2010 | Hashimoto |
| 8,299,557 | B2 | 10/2012 | Hashimoto |
| 8,581,358 | B2 | 11/2013 | Hashimoto |
| 2013/0214371 | A1* | 8/2013 | Asatsuma ......... H01L 31/02325 257/432 |
| 2014/0035085 | A1 | 2/2014 | Hashimoto |
| 2014/0300788 | A1 | 10/2014 | Sekine |
| 2015/0041833 | A1* | 2/2015 | Nimura ............. H01L 29/78633 257/88 |
| 2015/0221692 | A1* | 8/2015 | Enomoto .......... H01L 27/14623 257/435 |

FOREIGN PATENT DOCUMENTS

| JP | 2006-196626 A | 7/2006 |
| JP | 2009-272650 A | 11/2009 |
| JP | 2011-135100 A | 7/2011 |
| JP | 2011-176325 A | 9/2011 |
| JP | 2012-084815 A | 4/2012 |

* cited by examiner

*Primary Examiner* — Tuan Ho
(74) *Attorney, Agent, or Firm* — Fitzpatrick, Cella, Harper & Scinto

(57) ABSTRACT

A back-side illumination solid-state imaging apparatus, comprising a light-shielding member including a plurality of openings, and a plurality of pixels corresponding to the plurality of openings, wherein each pixel includes a photoelectric conversion portion, a microlens and an inner lens, the inner lens of a first pixel of an Mth row×an Nth column and the inner lens of a second pixel of an (M+1)th row×an (N+1)th column are separated from each other through a dielectric member, and the dielectric member contacts with part of the light-shielding member between a first opening corresponding to the first pixel and a second opening corresponding to the second pixel.

18 Claims, 7 Drawing Sheets

PRIOR ART

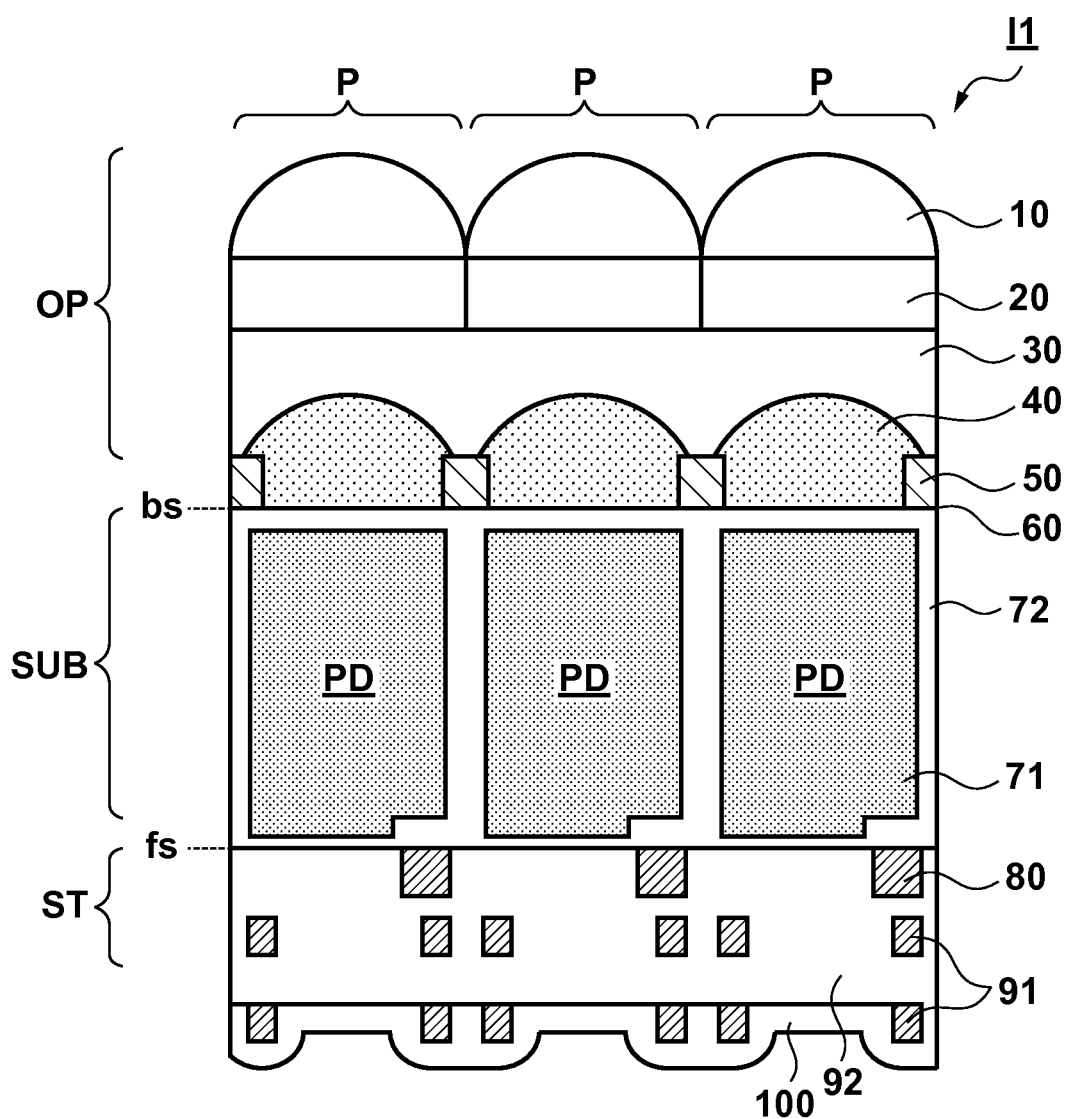

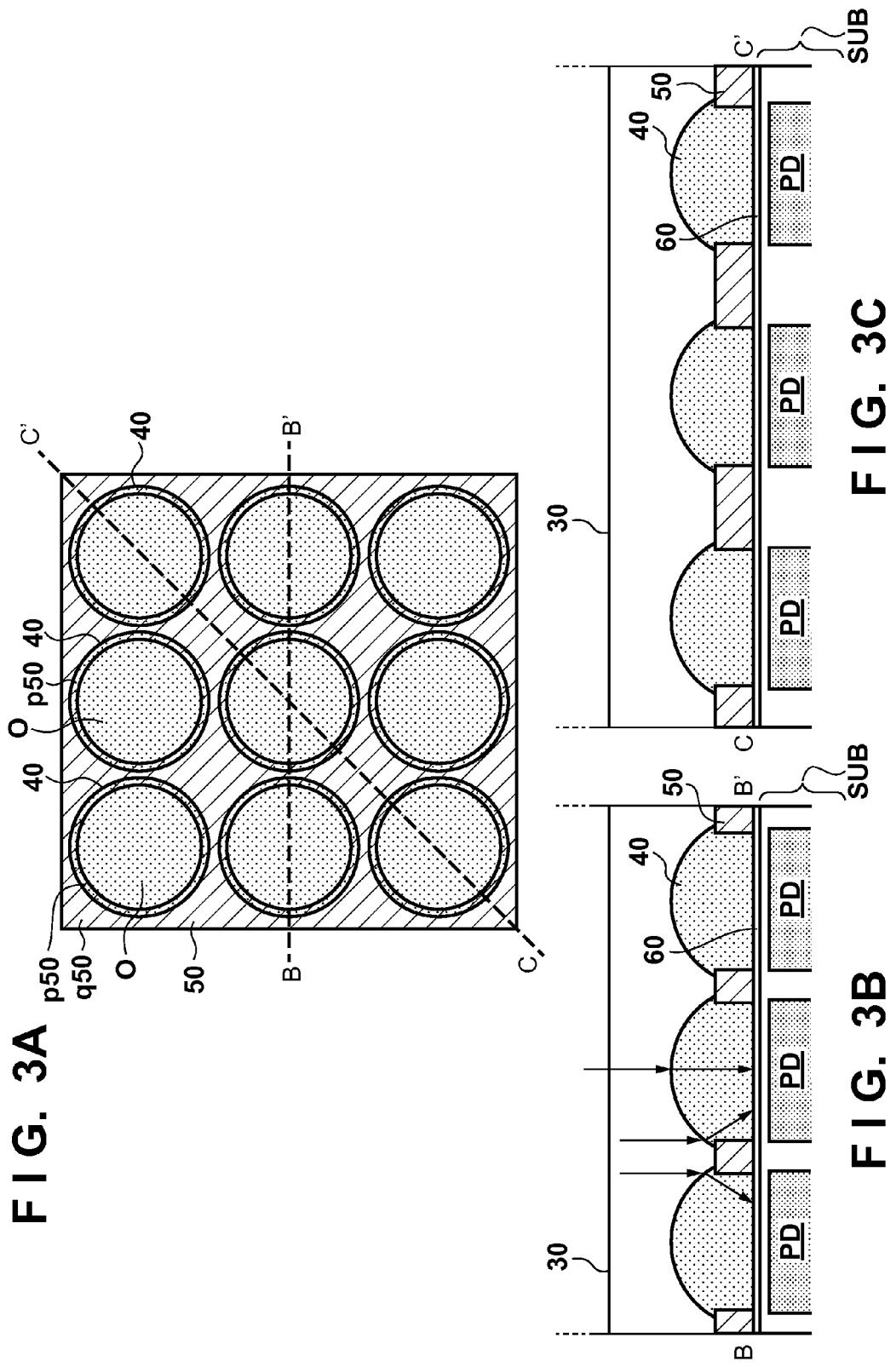

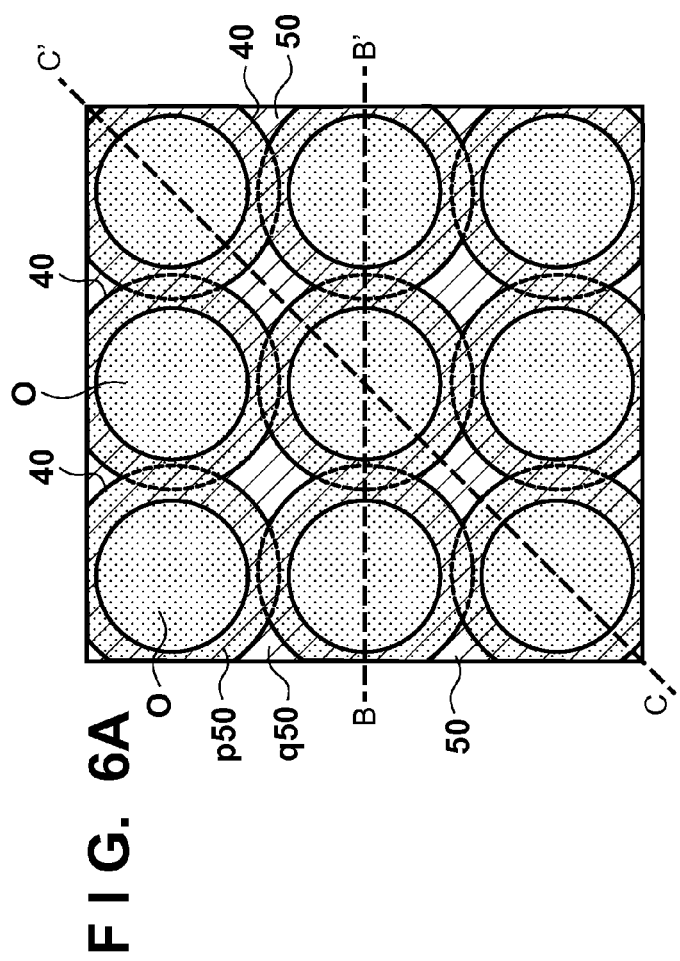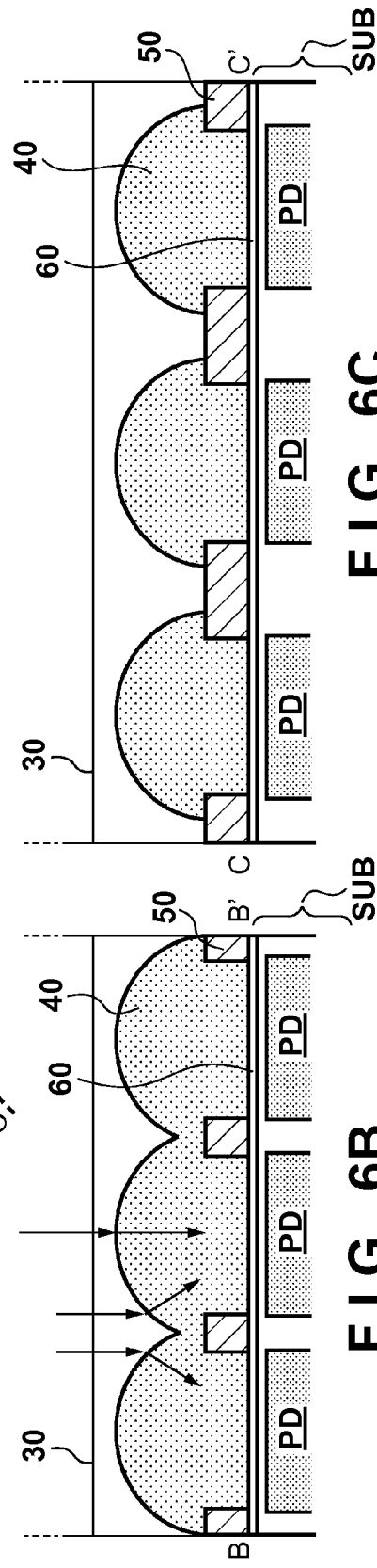

SOLID-STATE IMAGING APPARATUS, METHOD FOR MANUFACTURING THE SAME, AND CAMERA

BACKGROUND OF THE INVENTION

1. Field of the Invention

The present invention relates to a solid-state imaging apparatus, a method for manufacturing the same, and a camera.

2. Description of the Related Art

A back-side illumination solid-state imaging apparatus includes a substrate including a photoelectric conversion portion, an optical system arranged on the back side of the substrate, and a structure arranged on the front side of the substrate and including a wiring layer and an interlayer insulation film.

A light-shielding member having an opening on a photoelectric conversion portion is provided on the back side of the substrate in order to prevent leakage of light between adjacent pixels which causes a color mixture. The light-shielding member can be made of, for example, a light-shielding material such as a metal material. The optical system can include, in addition to a microlens, an inner lens arranged between the photoelectric conversion portion and the microlens to improve light sensitivity. Japanese Patent Laid-Open No. 2011-135100 describes a back-side illumination solid-state imaging apparatus which uses an inner-layer lens and a light-shielding film.

An example of the arrangement of a back-side illumination solid-state imaging apparatus $I_D$ which includes a substrate SUB including photoelectric conversion portions PD, an optical system OP including microlenses ML and inner lenses IL, and a metal pattern $P_M$ having openings O will be described with reference to FIGS. 1A and 1B. FIG. 1A is a schematic view showing the upper surface of the metal pattern $P_M$ of the solid-state imaging apparatus $I_D$. FIG. 1B is a schematic view showing the sectional structure of the solid-state imaging apparatus $I_D$ taken along a cut line A-A'.

A lens member which forms each inner lens IL can be provided on the metal pattern $P_M$ to cover the metal pattern $P_M$. When light L enters the upper surface of the metal pattern $P_M$ from the microlens ML side, as illustrated in FIG. 1B, multiple reflection can occur inside the lens member which forms each inner lens IL. The quality of an image obtained by the solid-state imaging apparatus $I_D$ can be deteriorated by entry of the light L owing to the multiple reflection into the photoelectric conversion portion PD.

As shown in FIG. 1A, in the upper surface of the metal pattern $P_M$, a distance D1 between the openings O in a cut line A-A' direction is larger than a distance D2 between the openings O in a horizontal direction. The influence of the above-described multiple reflection is attributed, for the most part, to multiple reflection which has occurred in the portion of the distance D2.

Japanese Patent Laid-Open No. 2009-272650 discloses a front-side illumination solid-state imaging apparatus. In contrast to a front-side illumination structure, the structure which includes the wiring layer and the interlayer insulation film is not arranged between the substrate and the optical system in a back-side illumination structure. Accordingly, the back-side illumination structure is smaller than the front-side illumination structure in terms of a distance between a metal light-shielding member covering the lens member which forms each inner lens and the substrate including the photoelectric conversion portions, and is susceptible to the light owing to the above-described multiple reflection.

SUMMARY OF THE INVENTION

The present invention has been made in recognition of the above problem by the present inventor, and provides a technique advantageous in improving the quality of an image obtained by a back-side illumination solid-state imaging apparatus.

One of the aspects of the present invention provides a solid-state imaging apparatus comprising a substrate on which a plurality of photoelectric conversion portions are arranged, a light-shielding member arranged on one side of the substrate, and a wiring member arranged on other side of the substrate, and including a plurality of pixels arrayed in a matrix and each corresponding to any one of a plurality of openings provided in the light-shielding member, wherein each of the plurality of pixels includes the photoelectric conversion portion and a lens arranged on the one side of the substrate, the light-shielding member is provided to locate the opening corresponding to each pixel between a surface of the lens which is on a side opposite to the photoelectric conversion portion in each pixel and the photoelectric conversion portion, the plurality of pixels include a first pixel of an mth row×an nth column, a second pixel of an (m+1)th row×an (n+1)th column, and a third pixel of the mth row×the (n+1)th column, where m and n are natural numbers, the plurality of openings include a first opening corresponding to the first pixel, a second opening corresponding to the second pixel, and a third opening corresponding to the third pixel, a distance between the first opening and the second opening is larger than that between the first opening and the third opening, the lens in the first pixel and the lens in the second pixel are separated from each other through a dielectric member with a refractive index different from that of the lens in the first pixel and that of the lens in the second pixel, and the dielectric member contacts a portion between the first opening and the second opening of the light-shielding member.

Further features of the present invention will become apparent from the following description of exemplary embodiments with reference to the attached drawings.

BRIEF DESCRIPTION OF THE DRAWINGS

FIG. 2 is a view for explaining an example of the arrangement of the back-side illumination solid-state imaging apparatus according to some embodiments;

FIGS. 3A to 3C are views for explaining an example of the arrangement of inner lens portions in the back-side illumination solid-state imaging apparatus;

FIGS. 6A to 6C are views for explaining another example of the arrangement of inner lens portions in a back-side illumination solid-state imaging apparatus.

DESCRIPTION OF THE EMBODIMENTS

First Embodiment

Figure 1A:
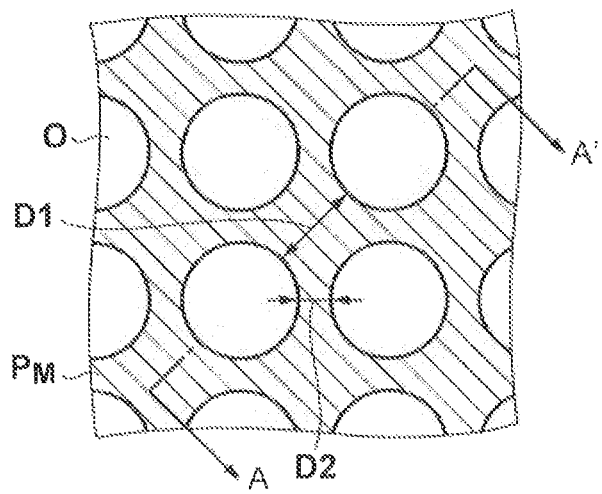
FIGS. 1A and 1B are views for explaining a reference example of the arrangement of a back-side illumination solid-state imaging apparatus.
Figure 1B:
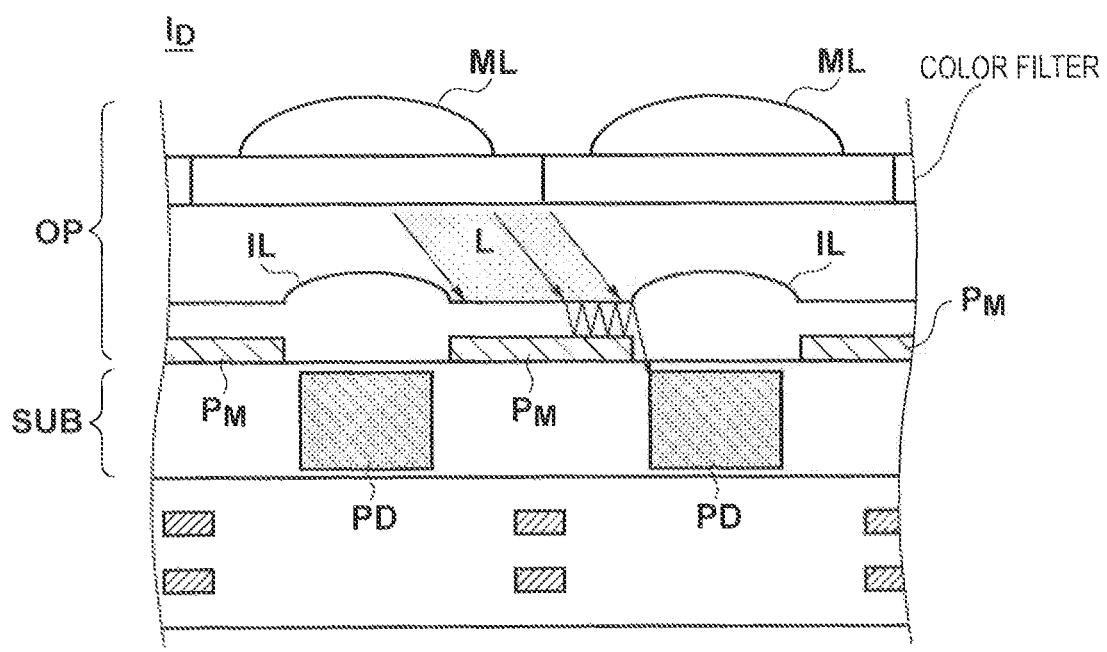

A solid-state imaging apparatus I1 according to the first embodiment will be described with reference to FIG. 2 and FIGS. 3A to 3C. FIG. 2 is a schematic view showing the sectional arrangement of the solid-state imaging apparatus I1. The solid-state imaging apparatus I1 includes a substrate SUB such as a silicon substrate, an optical system OP arranged on the side of a bs surface (back side) which is one side of the substrate SUB, and a wiring member ST arranged on the side of an fs surface (front side) which is other side of the substrate SUB and including a wiring layer and an interlayer insulation film.

The solid-state imaging apparatus I1 has a plurality of pixels P which are arrayed to form a plurality of rows and a plurality of columns. For the descriptive simplicity, a portion including three pixels P is illustrated here. Each pixel P has a photoelectric conversion portion PD provided on the substrate SUB, a microlens 10 arranged above the photoelectric conversion portion PD, and an inner lens 40 arranged between the photoelectric conversion portion PD and the microlens 10. The optical system OP includes a microlens array formed from the plurality of microlenses 10 and an inner lens array formed from the plurality of inner lenses 40. The inner lens array is located between the microlens array and the substrate SUB. Each pixel P can include a color filter 20 arranged between the microlens 10 and the inner lens 40. The optical system OP includes a color filter array formed from the plurality of color filters 20. The color filter array is located between the inner lens array and the microlens array.

The photoelectric conversion portions PD are, for example, p-n junction photodiodes, and can be formed by providing an n-type semiconductor region 71 in a p-type semiconductor region 72. Each inner lens 40 can be provided on the substrate SUB on, for example, a protective film 60. Each inner lens 40 uses, for example, silicon nitride and can be formed by a plasma CVD method or a high-density plasma CVD method. A dielectric member 30 is located between the inner lenses 40 which are adjacent to each other. The dielectric member 30 is made of a material and has a refractive index, both of which are different from those of the inner lenses 40. The dielectric member 30 and the color filters 20 or the microlenses 10 may have different refractive indices or the same refractive index. Although the dielectric member 30 is typically a solid, it may be a liquid or a gas. The color filters 20 and a planarizing film made of translucent members can also be arranged between the microlenses 10 and the inner lenses 40. Each color filter 20 can be provided on the planarizing film on the inner lens 40. In this embodiment, the dielectric member 30 between the inner lenses 40 is extended between the microlenses 10 and the inner lenses 40, and also serves as the planarizing film made of the translucent member. However, the translucent member between the microlenses 10 and the inner lenses 40 and the dielectric member between the inner lenses 40 may be different.

A light-shielding member 50 having openings O on the photoelectric conversion portions PD is arranged on the substrate SUB. The light-shielding member 50 can be made of, for example, a light-shielding material such as a metal material. The plurality of openings O are provided in the light-shielding member 50. Each opening O corresponds to any one of the plurality of pixels P. In each pixel P, the opening O is located between the photoelectric conversion portion PD and the upper surface of the inner lens 40 (the front side on the microlens 10 side).

On the fs surface side of the substrate SUB, the wiring member ST including a wiring layer in which a wiring pattern 91 is arranged and an interlayer insulation film 92 is provided. Each transistor configured to read out a pixel signal from the photoelectric conversion portion PD is also provided on the fs surface of the substrate SUB. A gate electrode 80 provided on a gate insulation film on the fs surface is illustrated here. In addition, a passivation film 100 is provided to cover the wiring pattern 91 and the interlayer insulation film 92. The passivation film 100 uses, for example, silicon nitride and formed by a plasma CVD method or a high-density plasma CVD method. Note that the wiring member ST including the two wiring layers has been illustrated here, for the descriptive simplicity. However, the number of layers is not limited to this.

As described above, the solid-state imaging apparatus I1 adopts the back-side illumination structure.

FIGS. 3A to 3C are schematic views for explaining a boundary region (to be referred to as a "region K" hereinafter) between the substrate SUB and the optical system OP, and mainly shows the inner lenses 40 and the light-shielding member 50. FIG. 3A shows the upper surface of the light-shielding member 50 and the outer edge of each inner lens 40. The openings O corresponding to the 3 (row)×3 (column) pixels P are illustrated here, for the descriptive simplicity. Each opening O has, for example, a circular shape. Each inner lens 40 is provided to cover a part p50 of the upper surface of the light-shielding member 50. Hence, each inner lens 40 and the light-shielding member 50 overlap each other in a direction perpendicular to the bs surface serving as a light receiving surface. Note that in FIG. 3A, reference symbol q50 denotes a portion of the upper surface of the light-shielding member 50 which is not covered with the inner lenses 40. The inner lenses 40 which are adjacent to each other are separated from each other and do not contact each other on the light-shielding member 50.

FIG. 3B is a schematic view showing the portion of the region K of the sectional structure of the solid-state imaging apparatus I1 taken along a cut line B-B'. The cut line B-B' is a cut line along the row direction in FIG. 3B. However, the same also applies to a cut line along the column direction. The column direction and the row direction will generically be referred to as an opposite-side direction. As in FIG. 3B, FIG. 3C is a schematic view showing the portion of the region K taken along a cut line C-C'. In a pixel array forming a matrix, the cut line C-C' is a cut line along a direction which passes through an mth (row)×nth (column) pixel and an (m+1)th (row)×(n+1)th (column) pixel, where m and n are natural numbers. The same also applies to a cut line along a direction which passes through the mth (row)×nth (column) pixel and an (m+1)th (row)×(n−1)th (column) pixel. These directions will be referred to as an opposite-corner direction (diagonal direction).

A high refractive index material such as silicon nitride (whose refractive index is 2.0) can be used for the inner lenses 40. The dielectric member 30 whose refractive index is lower than that of each inner lens 40 is provided on the inner lenses 40. This causes each inner lens 40 to function as a condenser lens. The dielectric member 30 functions as the planarizing film. For this planarizing film, a translucent material such as an organic resin (whose refractive index is 1.5) can be used, and another dielectric member may be formed. As shown in, for example, FIG. 3B, light which has entered each inner lens 40 is refracted on the upper surface and focused toward the photoelectric conversion portion PD.

According to the above-described structure, the adjacent inner lenses 40 are separated from each other and do not contact each other on the light-shielding member 50. In particular, the adjacent inner lenses 40 in the opposite-corner direction (on the cut line C-C') do not contact each other on the light-shielding member 50. The dielectric member 30 located between the adjacent inner lenses 40 in the opposite-corner direction is in contact with the part q50 on the upper surface of the light-shielding member 50. This makes a portion having the same refractive index as each inner lens 40 discontinuous between the inner lenses 40 which are adjacent to each other in the opposite-corner direction. The dielectric member 30 located between the adjacent inner lenses 40 in the opposite-side direction is in contact with the light-shielding member 50. According to this structure, since there is the portion q50 which is not covered with a lens material member forming each inner lens 40 on the upper surface of the light-shielding member 50, the multiple reflection that can be caused by entry of light from the microlens 10 side into the upper surface of the light-shielding member 50 is almost prevented. As a result, the amount of the light owing to the multiple reflection of the light entering each photoelectric conversion portion PD is reduced. Therefore, this embodiment is advantageous in improving the quality of an image obtained by the back-side illumination solid-state imaging apparatus.

When a pixel pitch in the opposite-side direction such as in the same row or in the same column is set to P, a distance from the bs surface (back side) serving as the light receiving surface of the substrate SUB to the top portion of each inner lens 40 is preferably set to be smaller than $\sqrt{2} \times P$. This is because when imaginary spheres whose surfaces contact each other in the opposite-corner direction are spread in a matrix on the substrate SUB, the diameter of each imaginary sphere is equal to the pixel pitch ($\sqrt{2} \times P$) in the opposite-corner direction. Also, a distance from the upper surface of the light-shielding member 50 to the top portion of each inner lens 40 is preferably set to be smaller than $P/\sqrt{2}$. When an imaginary hemisphere having a diameter of ($\sqrt{2} \times P$) is provided so that its bottom surface is in contact with the light-shielding member 50, a height of the top portion from the bottom surface of the hemisphere is equal to a radius of the hemisphere.

Assume that $0 < L \leq (\sqrt{2}-1) \times P$ holds where L is an interval between the inner lenses 40 in the opposite-corner direction. This makes it possible to maximize the width of each inner lens 40 in the opposite-corner direction while reducing leakage of light.

Each inner lens 40 is provided inside the opening O of the light-shielding member 50 (on the side wall of the light-shielding member 50 and the upper surface of the protective film 60). Accordingly, each inner lens 40 is surrounded by the light-shielding member 50 in the direction parallel to the bs surface serving as the light receiving surface. When each inner lens 40 is made of silicon nitride formed under, for example, a hydrogen atmosphere, a hydrogen atom from the silicon nitride can terminate a dangling bond on the front side of the substrate SUB. That is, by arranging the silicon nitride which forms each inner lens 40 in the opening of the light-shielding member 50, hydrogen configured to terminate the dangling bond is supplied when manufacturing the solid-state imaging apparatus I1. This reduces the dark current of the solid-state imaging apparatus I1, thus providing a further advantage in improving the quality of the image.

One mode of the present invention has been exemplified above with reference to FIG. 2 and FIGS. 3A to 3C. However, the present invention is not limited to this structure. For example, the light-shielding member 50 may be covered with a second protective film (not shown), and the second protective film may be provided, for example, under each inner lens 40 to cover the light-shielding member 50 and the protective film 60. In this structure, the second protective film and the protective film 60 may be provided to function as antireflection films which prevent light reflection that can occur between the substrate SUB and the inner lenses 40.

Second Embodiment

Figure 4A:
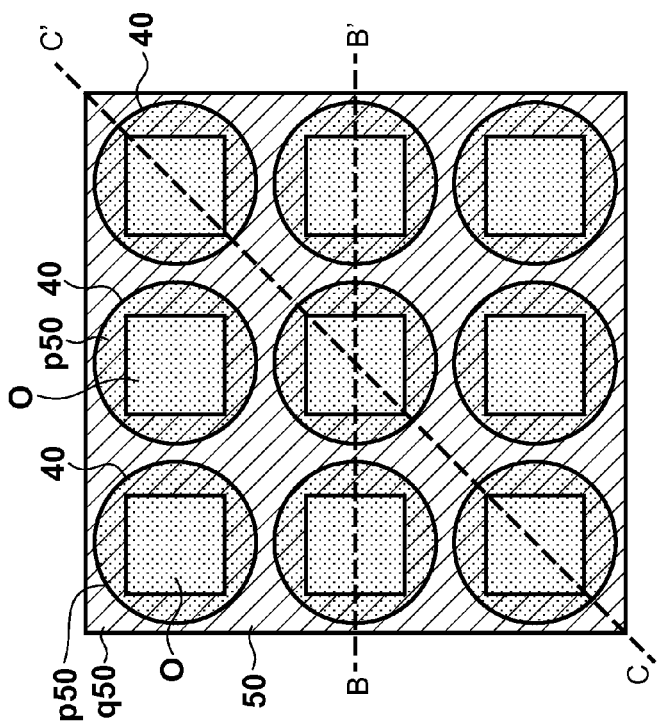
FIGS. 4A to 4C are views for explaining another example of the arrangement of the inner lens portions in the back-side illumination solid-state imaging apparatus.
Figure 4C:
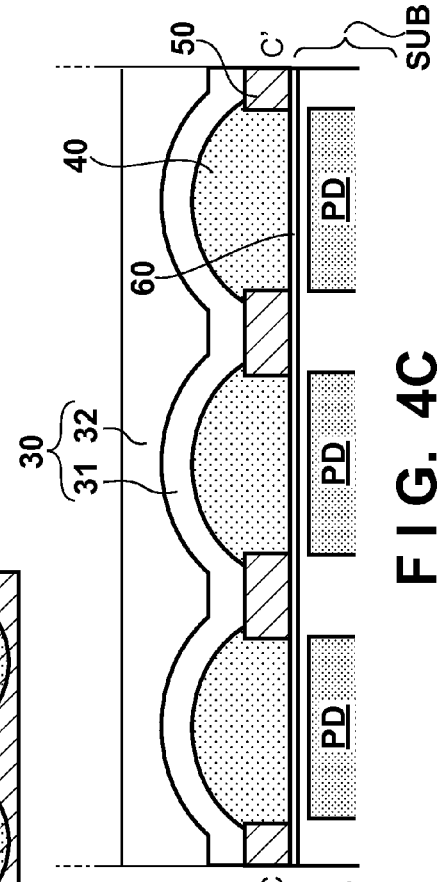
Figure 4B:
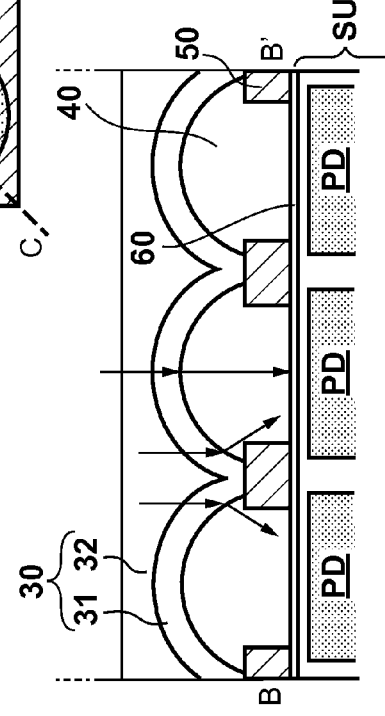

While FIGS. 3A to 3C show the dielectric member 30 as the planarizing film, FIGS. 4A to 4C show a mode in which a dielectric member 30 includes a coating film 31 and a planarizing film 32. The coating film 31 is provided along the upper surface of each inner lens 40 (a front side on a microlens 10 side), and has a top side protruding on the microlens 10 side (the front side on the microlens 10 side). The coating film 31 can function as a protective film and/or an antireflection film. The coating film 31 serving as the antireflection film is a multilayer film or a single-layer film which includes a layer whose refractive index is lower than that of each inner lens 40. Typically, the refractive index of the coating film 31 serving as the antireflection film is lower than that of each inner lens 40 and higher than that of the planarizing film 32. If silicon nitride is used for inner lenses 40, silicon oxynitride can be used for the coating film 31.

The coating film 31 covers the upper surface of each inner lens 40 (the front side on the microlens 10 side), and may be provided to cover the upper surfaces of a light-shielding member 50 and each inner lens 40. The coating film 31 can be provided in contacting the light-shielding member 50. That is, lens members which form the inner lenses 40 can be separated from each other on the light-shielding member 50 through the dielectric member 30. The antireflection film can be provided so that the thickness of an optical film is $\lambda/4$, where $\lambda$ is the wavelength of incident light, and is sufficiently thin. An influence on leakage of light into adjacent pixels can be ignored.

The film which separates the inner lenses 40 from each other is preferably a film whose refractive index is lower than that of each inner lens 40. If the refractive index of the planarizing film 32 is lower than that of the coating film 31, it is preferable to place the planarizing film 32 closer to the light-shielding member 50. The coating film 31 is preferably formed to have a smaller thickness than the light-shielding member 50. In this example, the planarizing film 32 can form a convex shape in correspondence with the concave shape of the coating film 31. Therefore, it is possible to make a distance between a portion having the convex shape of the planarizing film 32 and the light-shielding member 50 smaller than the thickness of the light-shielding member 50.

Furthermore, the structure in which each opening O of the light-shielding member 50 has a circular shape has been illustrated in FIGS. 3A to 3C. However, as illustrated in FIGS. 4A to 4C, each opening O may have a rectangular shape. FIGS. 4A to 4C shows, as in FIGS. 3A to 3C, the above-described region K in the structure in which each opening O has the rectangular shape. In the structure in which each opening O has the rectangular shape as well, a distance between the adjacent inner lenses 40 on a cut line C-C' is larger than that on a cut line B-B'. Therefore, in this structure as well, since the adjacent inner lenses 40 on the cut line C-C' do not contact each other, the same effect as described above is obtained. Note that although the openings O each having the rectangular shape have been illustrated here, the same also applies to a polygonal shape such as a hexagon or an octagon.

Third Embodiment

The above-described solid-state imaging apparatus I1 can be manufactured by using a known semiconductor manufacturing process. A method for forming a light-shielding member 50 and inner lenses 40 of a solid-state imaging apparatus I1 will mainly be described below with reference to FIGS. 5A to 5F.

Figure 5A:
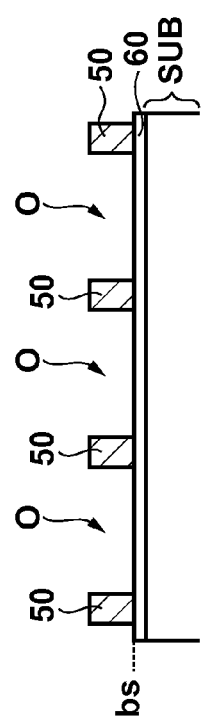
FIGS. 5A to 5F are views for explaining a part of an example of a method for manufacturing a back-side illumination solid-state imaging apparatus.

First, as illustrated in FIG. 5A, the above-described substrate SUB is prepared, and then a wiring member is formed on the side of an fs surface (front side) of the substrate SUB. After the substrate SUB is thinned, the light-shielding member 50 having openings O is formed on a protective film 60 on a bs surface of the substrate SUB. The light-shielding member 50 may be formed as a single layer using a metal material such as aluminum, tungsten, or copper, or formed as a stacked layer structure in which titanium nitride is provided on an aluminum film.

Figure 5B:
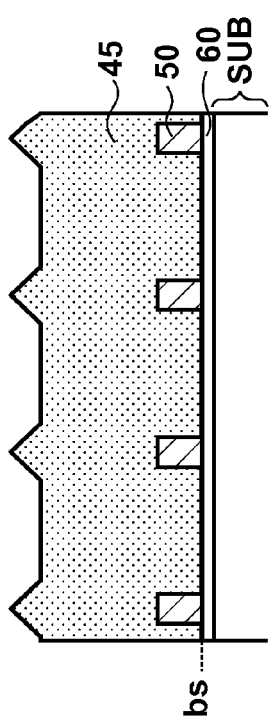
Figure 5C:
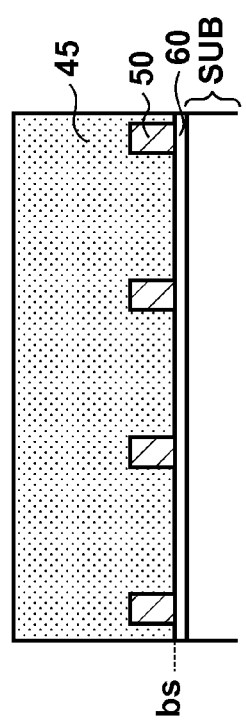

Next, as illustrated in FIG. 5B, a lens material film 45 made of silicon nitride or the like is formed to cover the light-shielding member 50 having the openings O. The lens material film 45 can be formed by, for example, a plasma CVD method or a high-density plasma CVD method. Then, as illustrated in FIG. 5C, planarization is performed on the surface of the member 45 by, for example, a CMP method.

Figure 5D:
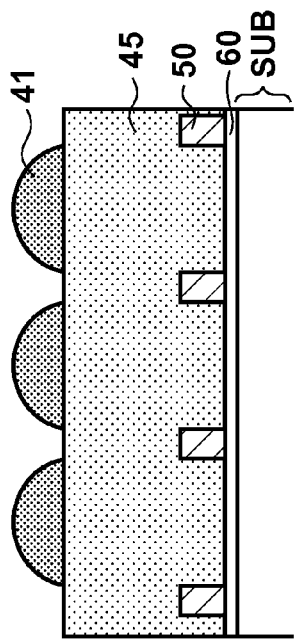

Next, as illustrated in FIG. 5D, resist patterns 41 each having a convex shape (desired lens shape) are formed on the planarized lens material film 45. The resist patterns 41 can be formed using, for example, a photolithography method and a thermal reflow method. The resist patterns 41 may be formed using a tone exposure method. Subsequently, the lens material film 45 is processed by etching using the resist patterns 41. More specifically, dry etching is performed using each resist pattern 41 as an etching mask. By doing so, the shape of each resist pattern 41 is transferred to the lens material film 45, and the inner lens 40 in accordance with the shape of each resist pattern 41 is formed.

Figure 5E:
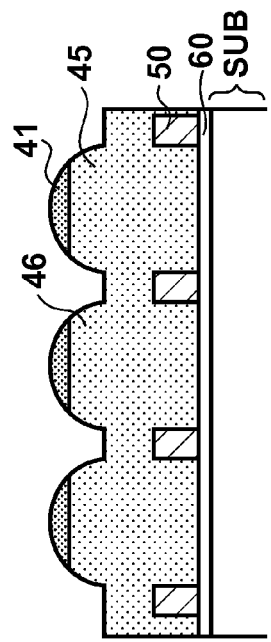
Figure 5F:
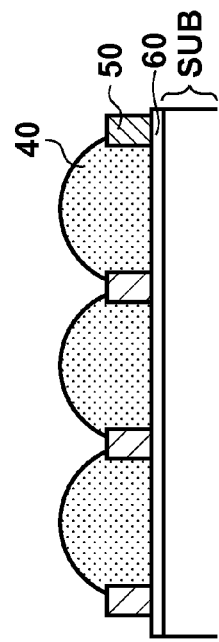

FIG. 5E is a schematic view showing a state during dry etching. FIG. 5F is a schematic view showing a state after the dry etching (after the completion of inner lens 40 formation). The dry etching is performed to expose a part of the upper surface of the light-shielding member 50. This forms a structure in which the adjacent inner lenses 40 do not contact each other on the light-shielding member 50, as described above.

Note that the dry etching can also adjust a distance between the inner lenses 40. By adjusting, for example, a process condition of the dry etching, a condition on which an etching reaction product is readily deposited on an exposed surface 46 of the member 45 may be set, as shown in FIG. 5E. This makes it possible to make the distance between the inner lenses 40 smaller than a distance between the resist patterns 41 in FIG. 5D. In addition, according to this condition, since the etching rate of the member 45 formed from silicon nitride can be made larger than that of the light-shielding member 50, damage to the light-shielding member 50 by etching can be reduced. After forming the inner lenses 40, annealing at a temperature of, for example, 450° or less may be performed.

Subsequently, a solid-state imaging apparatus I1 is obtained by forming a dielectric member 30 to cover inner lenses 40, and then forming color filters 20 and microlenses 10 on it.

Fourth Embodiment

The fourth embodiment will be described with reference to FIGS. 6A to 6C. FIGS. 6A to 6C illustrate the portion of a region K in this embodiment as in the first embodiment (FIGS. 3A to 3C). The structure of this embodiment is different from that of the first embodiment mainly in that adjacent inner lenses 40 on a cut line B-B' contact each other on a light-shielding member 50. That is, while the adjacent inner lenses 40 on a cut line C-C' do not contact each other on the light-shielding member 50, the adjacent inner lenses 40 on the cut line B-B' contact each other on the light-shielding member 50 and form a boundary.

When the pitch of a plurality of pixels in the opposite-side direction such as in the same row or in the same column is set to P, each distance from a bs surface of a substrate SUB to the top portion of the inner lens 40 is preferably set to be larger than P/4, and is more preferably set to be larger than P/3 so that the upper surface of each inner lens 40 has a sphere shape. Furthermore, the adjacent inner lenses 40 contacting each other on the cut line B-B' are preferably provided to maintain the sphere shapes. Each inner lens 40 is preferably provided, for example, as shown in FIG. 6B, so that a portion having a concave shape between the adjacent inner lenses 40 (in the vicinity of the boundary) forms a V shape. The V shape is preferably formed so that a distance from an upper surface of the light-shielding member 50 to a bottom of the V shape is a smaller thickness than the light-shielding member 50. The dielectric member 30 can form convex shapes in correspondence with the concave shapes between the inner lenses 40. Therefore, it is possible to make a distance between a portion having the convex shape of the dielectric member 30 and the light-shielding member 50 smaller than the thickness of the light-shielding member 50.

Note that the light-shielding member 50 is generally provided to a thickness of about 100 nm to 500 nm, and can be provided to the thickness of about, for example, 200 nm to 300 nm. The V shape is preferably formed so that the tilt of each inner lens 40 is, for example, 45° or more. Moreover, the V shape is preferably formed so that a nearly flat region whose tilt in a contact portion of each inner lens 40 is 10° or less becomes, for example, 100 nm or less. This structure can prevent light which has entered in the vicinity of a portion having the concave shape from leaking into the adjacent pixels.

According to the above-described structure, while the adjacent inner lenses 40 on the cut line C-C' do not contact each other on the light-shielding member 50, the adjacent inner lenses 40 on the cut line B-B' contact each other on the light-shielding member 50. According to this structure, it is possible to have a larger area in a planar view of the inner lenses 40 than in the first embodiment while preventing the most of multiple reflection that can be caused by entry of light from the microlens 10 side into the upper surface of the light-shielding member 50. Therefore, according to this embodiment, it is possible to further improve light sensitivity while obtaining the same effect as in the first embodiment.

Fifth Embodiment

Figure 7A:
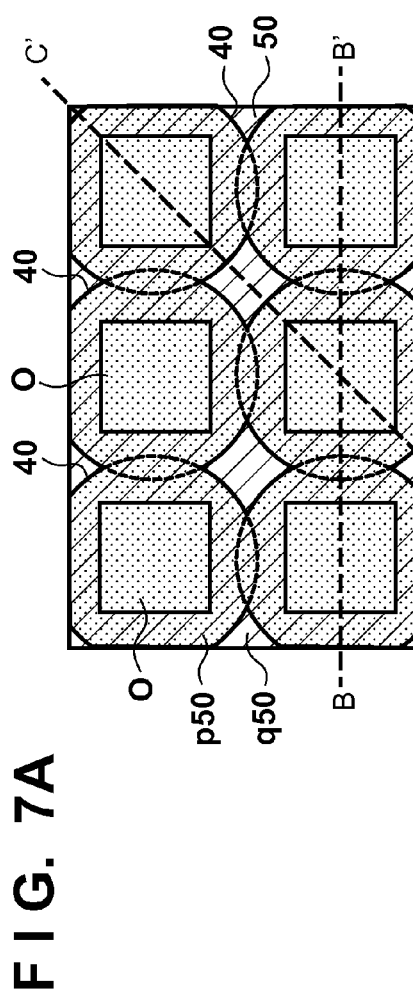
FIGS. 7A to 7C are views for explaining another example of the arrangement of inner lens portions in a back-side illumination solid-state imaging apparatus.
Figure 7C:
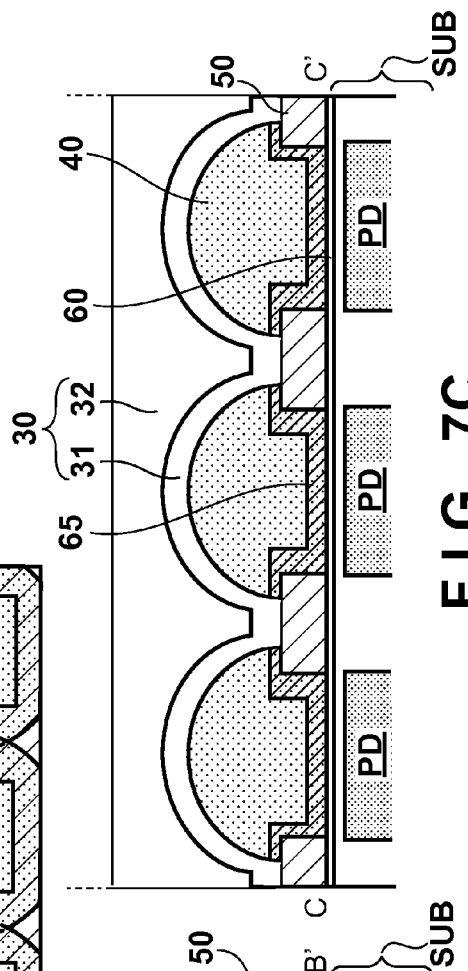
Figure 7B:
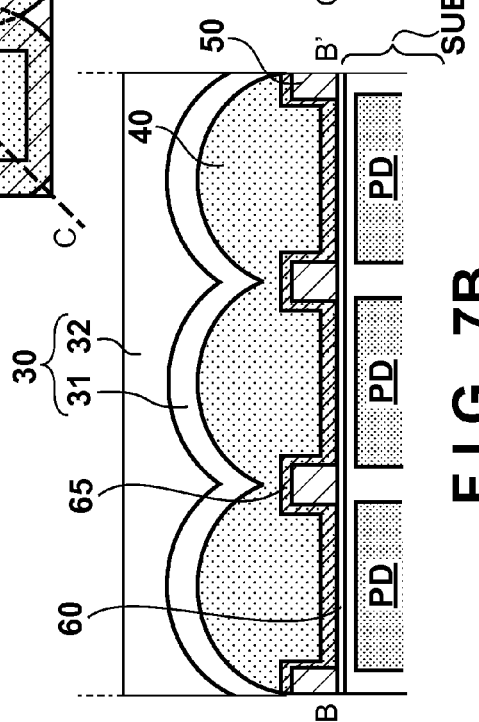

The fifth embodiment will be described with reference to FIGS. 7A to 7C. In a structure in FIGS. 7A to 7C, a light-shielding member 50 is covered with a dielectric film 65 having a refractive index different from that of each inner lens 40. Note that as illustrated in FIGS. 7A to 7C, the shape of each opening O may be a rectangular shape as in the above-described second embodiment. Each of the light-shielding member 50 and the dielectric film 65 is a component provided between the substrate SUB and at least one of the inner lens 40 and the dielectric member 30.

In this embodiment, a dielectric member 30 which is located between the inner lenses 40 adjacent to each other in an opposite-corner direction contacts not the light-shielding member 50 but the dielectric film 65 unlike in the first to the fourth embodiments. This makes a portion having the same refractive index as each inner lens 40 discontinuous between the inner lenses 40 which are adjacent to each other in the opposite-corner direction, thereby reducing the amount of light owing to multiple reflection as in the first to the fourth embodiments. This dielectric film 65 can function as the second protective film described in the first embodiment. Although the dielectric film 65 covers the side surfaces and the upper surface of the light-shielding member 50 in this example, it may cover only the upper surface of the light-shielding member and may not cover its side surfaces.

Also, the dielectric film 65 is provided to be further extended between, for example, the inner lenses 40 and a substrate SUB to cover a protective film 60. In this structure, the dielectric film 65 and the protective film 60 can function as antireflection films which prevent light reflection occurring between the substrate SUB and the inner lenses 40. For example, if silicon nitride is used for the inner lenses 40, silicon oxynitride whose refractive index is lower than that of each inner lens 40 can be used for the dielectric film 65. The refractive index of the dielectric film 65 may be higher than that of each inner lens 40. In this embodiment as well, it is preferable that a distance between the dielectric member 30 and the light-shielding member 50 is smaller than the thickness of the light-shielding member 50. This structure is implemented by making the thickness of the dielectric film 65 smaller than that of the light-shielding member 50.

A component including the light-shielding member 5 and being formed before forming the lens material film 45, is exposed in the etching of the lens material film 45. In this mode in which the dielectric film 65 is provided on the upper surface of the light-shielding member 50, the etching of a lens material film 45 described in the third embodiment can be performed to expose not the light-shielding member 50 but the dielectric film 65 provided before forming the lens material film 45. After formation of the light-shielding member 50 having the openings, the dielectric film 65 is provided to cover the upper surface and the side surfaces of the light-shielding member 50, and the lens material film 45 can be formed on it. After formation of a dielectric film on a light-shielding film without openings that form the light-shielding member 50, the light-shielding member 50 having the openings is formed by etching this dielectric film and the light-shielding member 50 at once. This makes it possible to form the dielectric film which covers the upper surface of the light-shielding member 50 having the openings and does not cover its side surfaces.

When the antireflection film covers the upper surface of each inner lens 40, it can be provided to cover the upper surface of each inner lens 40. FIGS. 7A to 7C also show an arrangement in which the dielectric member 30 includes a coating film 31 (first film) and a planarizing film 32 (second film). The coating film 31 is provided along the upper surface of each inner lens 40 (a front side on a microlens 10 side), and has a top side protruding on the microlens 10 side (the front side on the microlens 10 side). The coating film 31 can function as a protective film and/or the antireflection film.

The coating film 31 covers the upper surface of each inner lens 40 (the front side on the microlens 10 side), and may be provided to cover the upper surfaces of the light-shielding member 50 and each inner lens 40. The coating film 31 can be provided in contacting the light-shielding member 50. That is, a lens member which forms each inner lens 40 can be separated from each other on the light-shielding member 50 through the dielectric member 30. The antireflection film can be provided so that the thickness of an optical film is λ/4, where λ is the wavelength of incident light, and is sufficiently thin. An influence on leakage of light into adjacent pixels can be ignored. Furthermore, the dielectric member 30 is separated on the light-shielding member 50, and is provided in a state in which the planarizing film 32 contacts the light-shielding member 50.

As described above, when the plurality of films separate the inner lenses 40 on the light-shielding member 50, the leakage of light can further be reduced. The planarizing film and the coating film have been described above as the dielectric member 30 which contacts the light-shielding member 50 to separate the inner lenses 40. However, the present invention is not limited to this, and they may be used as the dielectric member 30 which causes color filters 20 and the microlenses 10 to contact the shielding member 50.

Again, as has been described, the shape of each opening O may be the rectangular shape. In this structure as well, the same effect as described above is obtained. Note that although the openings O each having the rectangular shape have been illustrated here, the same also applies to a polygonal shape such as a hexagon or an octagon.

The five embodiments have been described above. However, the present invention is not limited to these. The present invention can appropriately be modified and combined in accordance with the object, state, application purpose, function, and other specifications and can also be implemented by another embodiment.

(Imaging System)

In the above embodiments, the present invention has been described by exemplifying a solid-state imaging apparatus included in an imaging system represented by a camera or the like. The concept of the imaging system includes not only apparatuses primarily aiming at shooting but also apparatuses (for example, personal computer and portable terminal) secondarily having a shooting function. The imaging system can include the solid-state imaging apparatus according to the present invention exemplified in the above embodiments, and a processor that processes a signal output from the solid-state imaging apparatus. The processor can include a processor that processes A/D-converted digital data. An A/D converter can be provided on a substrate SUB having a photoelectric conversion portion or can be provided on a substrate different from the substrate SUB having the photoelectric conversion portion. A stacked solid-state imaging apparatus may be obtained by joining another substrate on which the A/D converter is formed with the substrate SUB having the photoelectric conversion portion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-219506, filed Oct. 22, 2013, which is hereby incorporated by reference herein in its entirety.

What is claimed is:

1. A solid-state imaging apparatus comprising a substrate on which a plurality of photoelectric conversion portions are arranged, a light-shielding member arranged on one side of the substrate, and a wiring member arranged on other side of the substrate, and including a plurality of pixels arrayed in a matrix and each corresponding to any one of a plurality of openings provided in the light-shielding member, wherein each of the plurality of pixels includes the photoelectric conversion portion and a lens arranged on the one side of the substrate, the light-shielding member is provided to locate the opening corresponding to each pixel between a surface of the lens which is on a side opposite to the photoelectric conversion portion in each pixel and the photoelectric conversion portion, the plurality of pixels include a first pixel of an mth row×an nth column, a second pixel of an (m+1)th row×an (n+1)th column, and a third pixel of the mth row×the (n+1)th column, where m and n are natural numbers, the plurality of openings include a first opening corresponding to the first pixel, a second opening corresponding to the second pixel, and a third opening corresponding to the third pixel, a distance between the first opening and the second opening is larger than that between the first opening and the third opening, the lens in the first pixel and the lens in the second pixel are separated from each other through a dielectric member with a refractive index different from that of the lens in the first pixel and that of the lens in the second pixel, and the dielectric member contacts a portion between the first opening and the second opening of the light-shielding member.

2. A solid-state imaging apparatus comprising a substrate on which a plurality of photoelectric conversion portions are arranged, a light-shielding member arranged on one side of the substrate, and a wiring member arranged on other side of the substrate, and including a plurality of pixels arrayed in a matrix and each corresponding to any one of a plurality of openings provided in the light-shielding member, wherein each of the plurality of pixels includes the photoelectric conversion portion and a lens arranged on the one side of the substrate, the light-shielding member is provided to locate the opening corresponding to each pixel between a surface of the lens which is on a side opposite to the photoelectric conversion portion in each pixel and the photoelectric conversion portion, the plurality of pixels include a first pixel of an mth row×an nth column, a second pixel of an (m+1)th row×an (n+1)th column, and a third pixel of the mth row×the (n+1)th column, where m and n are natural numbers, the plurality of openings include a first opening corresponding to the first pixel, a second opening corresponding to the second pixel, and a third opening corresponding to the third pixel, a distance between the first opening and the second opening is larger than that between the first opening and the third opening, the lens in the first pixel and the lens in the second pixel are separated from each other through a dielectric member with a refractive index different from that of the lens in the first pixel and that of the lens in the second pixel, and the dielectric member contacts a dielectric film with a refractive index different from that of the lens in the first pixel and that of the lens in the second pixel which covers a portion between the first opening and the second opening of the light-shielding member.

3. The apparatus according to claim 1, wherein a distance between a portion between the first opening and the third opening of the light-shielding member and the dielectric member is smaller than a thickness of the light-shielding member.

4. The apparatus according to claim 1, wherein the lens in the first pixel and the lens in the third pixel form a boundary on the light-shielding member.

5. The apparatus according to claim 1, wherein letting P be a pitch of the pixels in the same row, a distance from the substrate to a top portion of the lens is larger than P/4 and smaller than √2×P.

6. The apparatus according to claim 1, wherein a distance between the lens in the first pixel and the lens in the third pixel is (√2−1)×P at maximum.

7. The apparatus according to claim 1, wherein the lens overlaps the light-shielding member in a direction perpendicular to a light receiving surface of the substrate.

8. The apparatus according to claim 1, wherein the lens is surrounded by the light-shielding member in a direction parallel to the light receiving surface of the substrate.

9. The apparatus according to claim 1, wherein a refractive index of the dielectric member is lower than that of the lens, and the dielectric member is extended between the lenses.

10. The apparatus according to claim 1, wherein the dielectric member includes a side on the lens side and a coating film in which the side on the lens side is arranged along the side of the lens.

11. The apparatus according to claim 1, wherein the dielectric member includes a planarizing film in which the side of the lens is arranged along the side of the lens, and the side which is opposite to the side of the lens is flatter than the side on the lens side.

12. The apparatus according to claim 1, wherein the lens in the first pixel is located between the color filter and the photoelectric conversion portion in the first pixel.

13. The apparatus according to claim 1, wherein the lens in the first pixel is located between the microlens and the photoelectric conversion portion.

14. The apparatus according to claim 1, wherein each opening of the light-shielding member has one of a circular shape and a rectangular shape.

15. A camera comprising:
a solid-state imaging apparatus defined in claim 1; and
a processor configured to process a signal from the solid-state imaging apparatus.

16. A method for manufacturing a solid-state imaging apparatus, comprising:
forming a lens material film on a component including a light-shielding member in a state in which the light-shielding member including a plurality of openings corresponding to a plurality of photoelectric conversion portions is provided on one side of a substrate on which the plurality of photoelectric conversion portions are arranged, and a wiring member is provided on other side of the substrate;
forming a resist pattern of a convex shape corresponding to each of the plurality of openings on the lens material film; and
processing the lens material film into a lens shape by etching the resist pattern and the lens material film,
wherein the plurality of openings include a first opening, a second opening adjacent to the first opening, and a third opening adjacent to the first opening and the second opening, and a distance between the first opening and the second opening is larger than that of the first opening and the third opening, and
in the processing, the etching is performed to expose the component in a position corresponding to a portion between the first opening and the second opening of the light-shielding member.

17. The method according to claim 16, wherein the etching is performed to expose the light-shielding member.

18. The method according to claim 16, wherein the component includes a dielectric film covering the light-shielding member, and the etching is performed to expose the dielectric film.

* * * * *